United States Patent
Nangle

(12) 
(10) Patent No.: US 6,249,131 B1
(45) Date of Patent: *Jun. 19, 2001

(54) ELECTRONICS PACKAGE HAVING A BALL GRID ARRAY WHICH IS ELECTRICALLY ACCESSIBLE

(75) Inventor: Peter Nangle, Highworth (GB)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,181

(22) Filed: Aug. 31, 1998

(51) Int. Cl.[7] ............................. G01R 31/02; H01L 21/44
(52) U.S. Cl. ............................................. 324/754; 438/613
(58) Field of Search ..................................... 324/755, 760, 324/754; 438/613, 123, 124, 118

(56) References Cited

U.S. PATENT DOCUMENTS

| | | | |
|---|---|---|---|
| 5,543,724 | * 8/1996 | Chrostopher | 324/754 |
| 5,691,041 | * 11/1997 | Frankeny et al. | 428/209 |
| 5,731,709 | * 3/1998 | Pastore et al. | 324/760 |
| 5,808,474 | * 9/1998 | Hively et al. | 324/755 |
| 5,834,945 | * 11/1998 | Akram et al. | 324/755 |
| 5,952,840 | * 9/1999 | Farnworth et al. | 324/755 |

* cited by examiner

Primary Examiner—Safet Metjahic
Assistant Examiner—J Kerveros
(74) Attorney, Agent, or Firm—Blakely, Sokoloff, Taylor & Zafman LLP

(57) ABSTRACT

An electronic assembly comprising an electrical device, an array of solder balls connected to the electrical device, and a sheet adjacent the electrical device. The sheet has a plurality of holes formed therethrough and a plurality of electrical lines formed thereon. Each electrical line has a first contact portion on a first surface of the sheet, a probe contact at a location away from the electrical device, and a trace interconnecting the probe contact with the first contact portion. Each ball extends through a respective hole in the sheet. Each ball is also in contact with a respective first contact portion of a respective electrical line.

19 Claims, 4 Drawing Sheets

ELECTRONICS PACKAGE HAVING A BALL GRID ARRAY WHICH IS ELECTRICALLY ACCESSIBLE

BACKGROUND OF THE INVENTION

1. Field of the Invention

The present invention relates to a ball grid array electronics assembly wherein individual solder balls of the assembly are electrically accessible for testing purposes, a method of assembling such a package, and a method of testing an electrical device which has hidden connections.

2. Discussion of Related Art

An electronics assembly often comprises a substrate and an electrical device such as an integrated circuit. An array of solder balls may be used to attach the electrical device to the substrate. The electrical device may be mounted in a manner that prevents access to the solder balls.

It may in certain instances be required to test the electrical device by making electrical contact with one or more of the solder balls individually. Since the solder balls are hidden behind the electrical device and only a small gap exists between the substrate and the electrical device such electrical testing may not be possible.

One technique for testing such an electrical device involves forming electrical traces on the substrate. The traces contact the solder balls and extend out from under the electrical device to an accessible location on the substrate. A probe connected to an electrical tester may then be used to contact the traces at the accessible location. The electrical tester may then be used to test the electrical device.

The formation of additional traces on a substrate, such as a printed circuit board, leads to a larger, more costly substrate. Additionally, the test traces occupy valuable board space and limit the input/output and/or require more substrate layers. What may therefore be required is a solution wherein individual solder balls in a ball grid array assembly can be accessed for testing purposes and wherein additional traces do not have to be made on a substrate such as on a printed circuit board.

SUMMARY OF THE INVENTION

An electronic assembly comprising an electrical device, an array of solder balls connected to the electrical device, and a sheet adjacent the electrical device. The sheet has a plurality of holes formed therethrough and a plurality of electrical lines formed thereon. Each electrical line has a first contact portion on a first surface of the sheet, a probe contact at a location away from the electrical device, and a trace interconnecting the probe contact with the first contact portion. Each ball extends through a respective hole in the sheet. Each ball is also in contact with a respective first contact portion of a respective electrical line.

BRIEF DESCRIPTION OF THE DRAWINGS

The invention is further described by way of examples with reference to the accompanying drawings wherein.

DETAILED DESCRIPTION OF THE INVENTION

An electronics assembly is described having a substrate and an electrical device mounted to the substrate by an array of solder balls located between the substrate and the electrical device. A plastic sheet is located between the substrate and the electrical device. The plastic sheet has electrical lines formed thereon. Each electrical line has a first contact portion in contact with one of the balls, a trace extending from the first contact portion, and an access portion, connected to the trace, at a location off the electrical device. An electrical probe can be used to contact the access portion in order to electrically access the solder ball for purposes of testing the electrical device.

Figure 1:
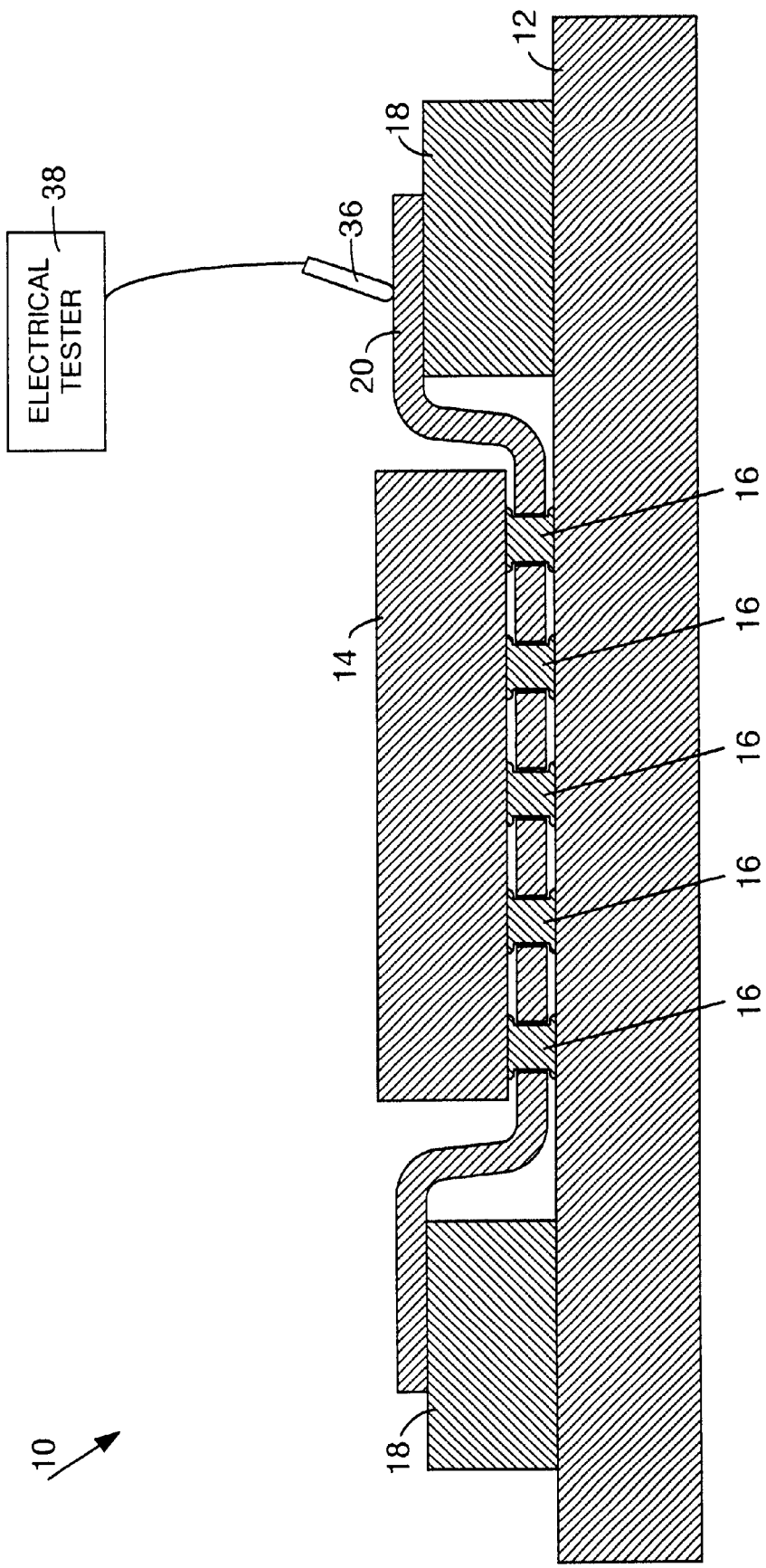
FIG. 1 is a sectioned side view of an electronics assembly, according to an embodiment of the invention, which includes a substrate, an electrical device which has an array of solder balls mounting the electrical device to the substrate, and a flexible plastic sheet between the substrate and the electrical device.

FIG. 1 of the accompanying drawings shows an electronic assembly 10 which includes a substrate 12 and an electrical device 14. The assembly includes an array of solder balls 16 that connect the electrical device to the substrate 12. The substrate 12 has steps 18 located adjacent the electrical device 14. The assembly 10 further has a plastic sheet 20 located partially between the substrate 12 and the electrical device 14 and partially out from under the electrical device 14.

The substrate 12 may be a printed circuit board, a package substrate or the like.

In the present embodiment the electrical device 14 may be an integrated circuit. It should, however, be understood that the electrical device may, for example, also be a semiconductor package having a package substrate and an integrated circuit mounted on the package substrate, or any other suitable device.

The solder balls 16 may be in what is known in the art as a "ball grid array" or a "micro ball grid array".

Each step 18 may be any component which is usually mounted to the substrate 12, such as an integrated circuit, a semiconductor package or the like.

Figure 2:
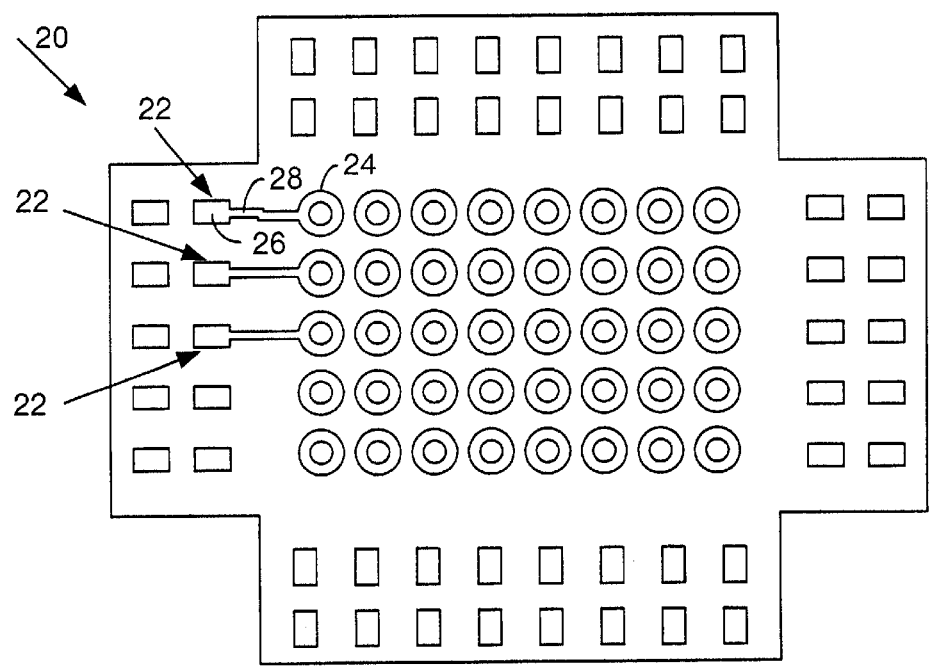
FIG. 2 is a top plan view of the plastic sheet of FIG. 1.

FIG. 2 is a plan view of the plastic sheet 20. The plastic sheet 20 may be a flex circuit sheet which is known in the art and may be made from a material such as a flexible polyimide. A plurality of electrical lines 22 may be formed on the plastic sheet 20. The lines 22 are typically made of copper. Each line 22 may have a first contact portion 24 in a central region of the plastic sheet 20, a probe contact 26 in an edge region of the plastic sheet 20, and a trace 28 interconnecting the first contact portion 24 with the probe contact 26. All the first contact portions 24 may be located in a rectangular array in the central region and all the probe contacts 26 may be located in arrays in edge regions of the plastic sheet 20. Although only a few electrical lines 22 are completely shown, it should be understood that each first contact portion 24 may be connected to a respective probe contact 26 by means of a respective trace (not shown).

Figure 3A:
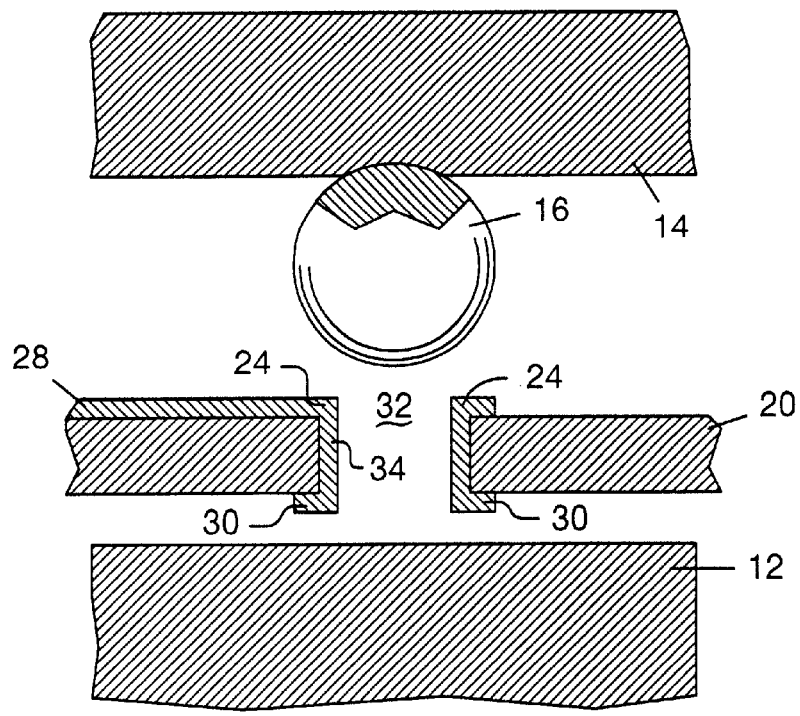
FIG. 3a is a sectioned side view illustrating the manufacture of the electronics package of FIG. 1 before the solder balls are secured to the substrate.
Figure 3B:
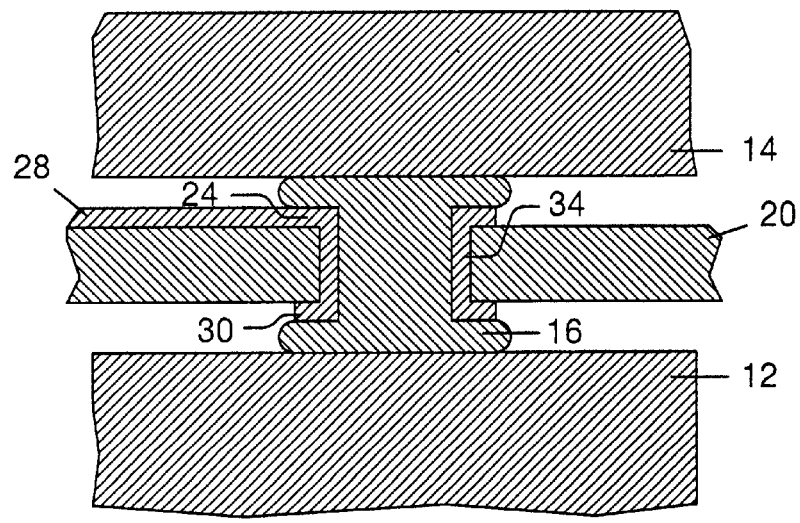
FIG. 3b is a view similar to FIG. 3a after the solder balls are secured to the substrate by reflow and soldering to the substrate.

FIGS. 3a and 3b illustrate the construction of the electronic assembly 10 of the FIG. 1.

FIG. 3a shows the substrate 12, the electrical device 14 with one of the solder balls 16 attached to the electrical device 14, the plastic sheet 20 located between the substrate 12 and the electrical device 14, and the substrate 12. The plastic sheet 20 may be located adjacent to electrical device 14 with one or more of the first contact portions 24 facing the electrical device 14 and aligned with a respective solder ball 16. The probe contacts 26 may be at a location away from the electrical device 14. The plastic sheet 20 may be held in in such position by means of an adhesive compound (not shown) between the electrical device 14 and the plastic sheet 20. The adhesive compound may be any suitable compound such as a solder paste which is screen printed to a required pattern on the plastic sheet 20 or the electrical device 14.

A second contact portion 30 may be formed on a side of the plastic sheet 20 opposing the first contact portion 24. A hole 32 may be punched or drilled through each plastic sheet 20. Each hole 32 may be formed through a respective first contact portion 24 and a respective second contact portion 30. To complete the formation of the line 22, a conductive material 34 may be deposited within each hole 32. The conductive material 34 may extend through the hole 32 and may interconnect the first and second portions 24 and 30. As with the rest of the line 22, the second contact portion 30 and the conductive material 34 may be made of copper.

FIG. 3b shows the arrangement of FIG. 3a after the electrical device 14, the plastic sheet 20 and the substrate 12 are brought together and the solder balls 16 are heated. Heating of the solder balls 16 causes softening of the material of the balls 16. Each ball 16 is then drawn into a respective hole 32 under capillary action between the material of the ball 16 and the materials of the first contact portion 24 the conductive material 34 and the second contact portion 30. The ball 16 continues to flow until it contacts a bond pad (not shown) of the substrate 12. The ball 16, after reflow, is partially located on opposing sides of the plastic sheet 20 and may be in contact with the second contact portion 30, the conductive material 34, the first contact portion 24, and the conductive pad (not shown) on the substrate 12.

Figure 4:
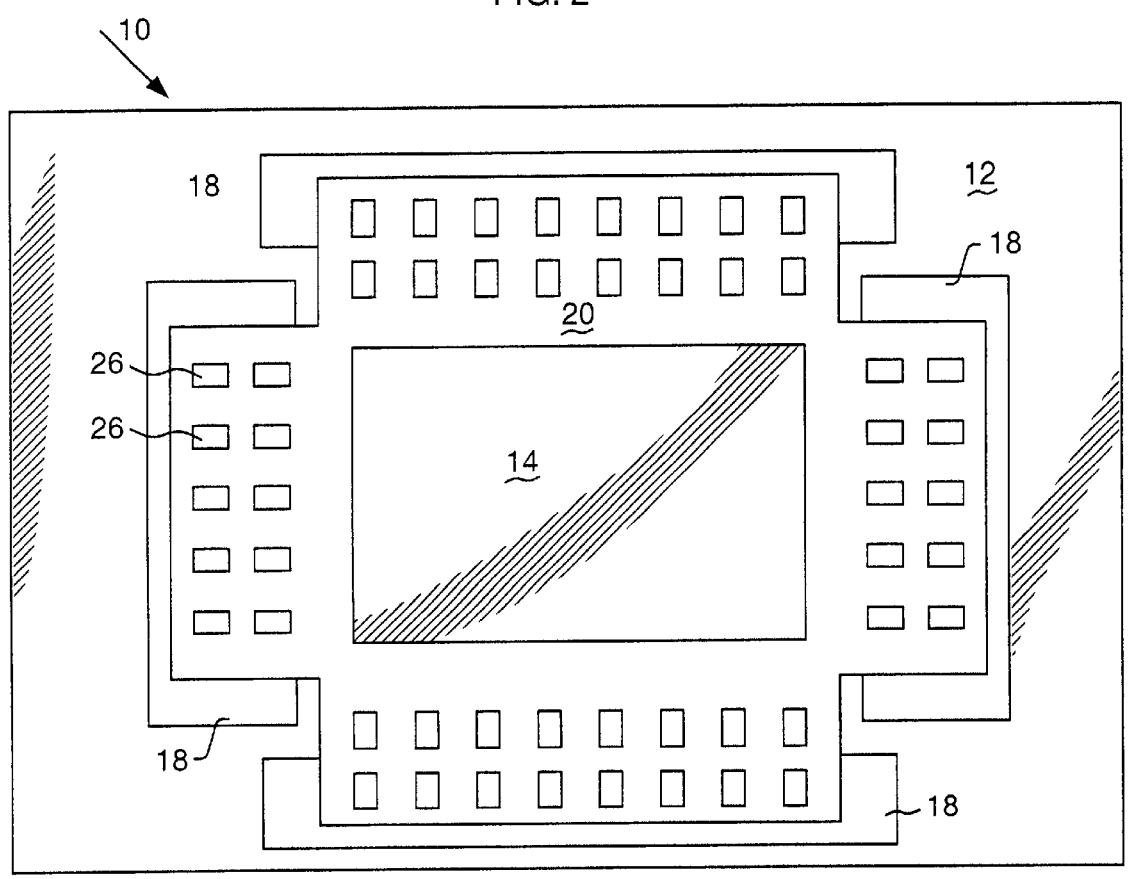
FIG. 4 is a top plan view of the electronics package of FIG. 1.

FIG. 4 is a plan view of the electronics package 10 after assembly. The electrical device 14 obscures the first contact portions 24 of the electrical lines 22. The probe contacts 26 are not obscured by the electrical device 14. The steps 18 may lift the probe contacts 26 off the substrate 12.

Each probe contact 26 is electrically connected to a respective solder ball 16. Each solder ball 16 is, in turn, electrically connected to the electrical device 14. As shown in FIG. 1, an electrical probe 36 can be used to contact one or more of the probe contacts 26. An electrical tester 38 connected to the electrical probe 36 can be used for testing the electrical device 14.

From the aforegoing description can be seen that individual solder balls 16 in a ball grid array assembly can be individually accessed for purposes of testing the electrical device 14. The solder balls 16 can be accessed without the need for forming additional traces on the substrate 12 which could result in a larger, more expensive substrate. Although the present invention has particular application for testing an electrical device having hidden ball grid array contacts, the invention may conceivably find application in testing electrical devices having other hidden connections.

Figure 5:
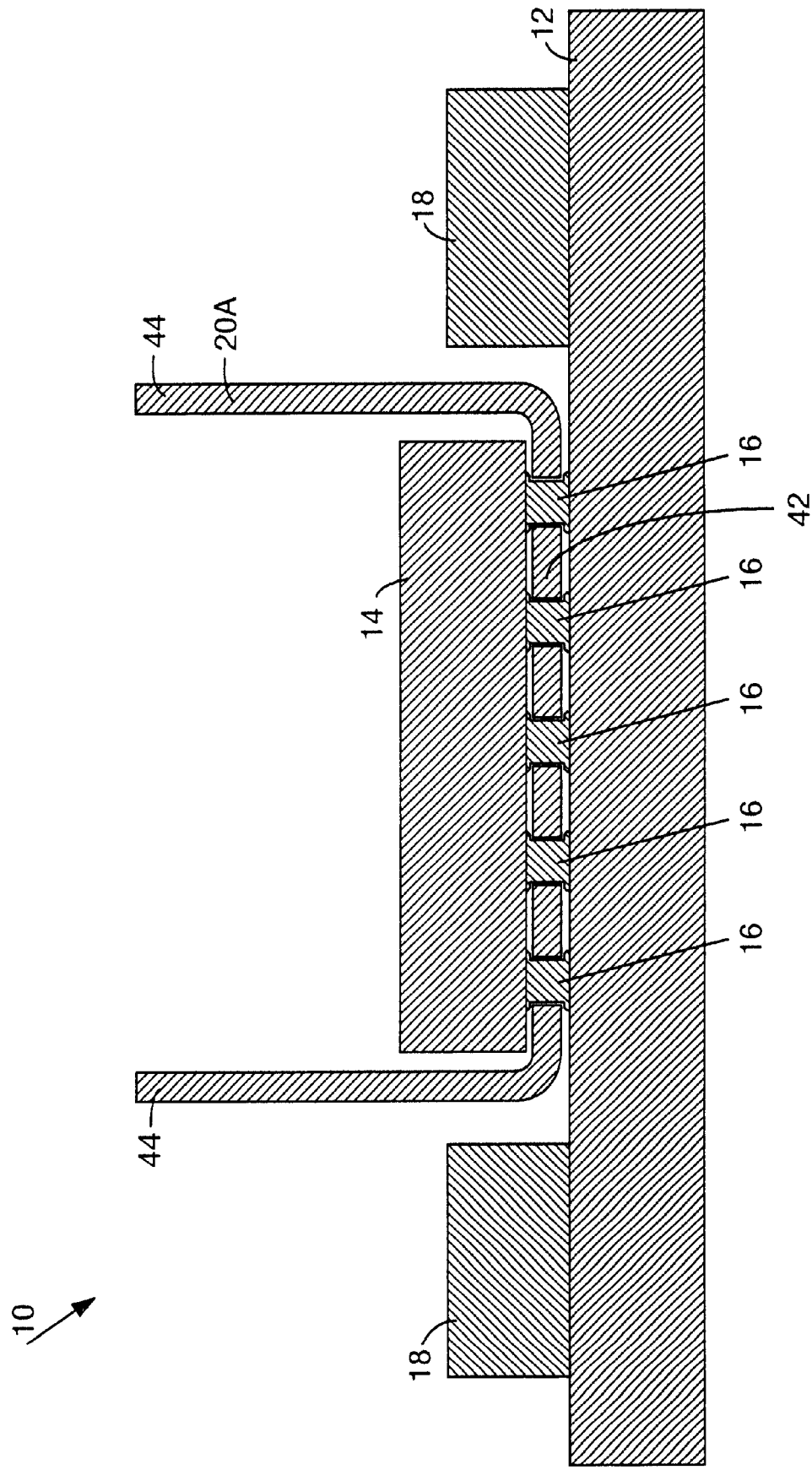
FIG. 5 is a sectioned side view of an electronics assembly, according to an alternative embodiment of the invention, which has a rigid plastic sheet in the form of a cup.

FIG. 5 illustrates the electronics assembly 10 of FIG. 1 wherein the plastic sheet 20 is replaced with a plastic sheet 20A which is made of a rigid material such as a rigid polymide.

The plastic sheet 20A is in the form of a cup having a central portion 42 located between the substrate 12 and the electrical device 14, and outer portions 44 extending from the central portion 42 away from the substrate 12. Probe contacts (not shown) of electrical lines may be located on the outer portions 44. Since the outer portions 44 extend away from the substrate 12, they are more accessible for purposes of being contacted with an electrical probe.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. An electronic assembly comprising:
   an electrical device;
   an array of solder balls connected to the electrical device; and
   a sheet adjacent the electrical device, the sheet having a plurality of holes formed therethrough and a plurality of electrical lines formed thereon, each electrical line having a first contact portion on a first surface of the sheet, a probe contact at a location away from the electrical device, and a trace interconnecting the probe contact and the first contact portion, wherein each ball extends through a respective hole in the first sheet, and each ball is in contact with a respective first contact portion of a respective electrical line.

2. The electronics assembly of claim 1 wherein each hole is through a respective first contact portion.

3. The electronic assembly of claim 1 wherein each line includes a conductive material formed through a respective hole.

4. The electronic assembly of claim 3 wherein the line includes a second contact portion formed on a second surface of the sheet opposing the first surface, and in contact with the conductive material.

5. The electronic assembly of claim 4 wherein the hole is through the second contact portion.

6. An electronic assembly comprising:
   a substrate;
   an electrical device;
   an array of solder balls that are connected to the electrical device and the substrate;
   a sheet between the substrate and the electrical device, the sheet having an opening through which one of the balls extends and an electrical line formed thereon, the electrical line having a first contact portion on a first surface of the sheet and in contact with one of the ball, a probe contact at a location away from the electrical device, and a trace interconnecting the first contact portion with the probe contact.

7. The electronic assembly of claim 6 wherein the sheet has a plurality of said openings with a respective ball extending through each opening, and a plurality of said electrical lines, each electrical line having a respective first contact portion in contact with a respective ball.

8. The electronic assembly of claim 6 wherein the hole is through the first contact portion.

9. The electronic assembly of claim 6 wherein the line includes a conductive metal formed through the hole.

10. The electronic assembly of claim 9 wherein the line includes a second contact portion formed on a second surface of the sheet opposing the first surface, and in contact with the conductive metal.

11. The electronic assembly of claim 10 wherein the hole is through the second contact portion.

12. The electronic assembly of claim 6 wherein the probe contact is spaced further from the substrate than the contact portion.

13. The electronic assembly of claim 12 further comprising a step which lifts the probe contact off the substrate.

14. A method comprising:

placing a sheet adjacent an electrical device to which a plurality of solder balls are attached, the sheet having a plurality of holes formed therethrough and a plurality of electrical lines formed thereon, each electrical line having a first contact portion adjacent the electrical device, a probe contact, and a line;

interconnecting the first contact portion and the probe contact; and heating the solder balls so that each solder ball partially flows through a respective hole whereafter each solder ball is in contact with a respective first contact portion.

15. The method of claim 14 wherein each probe contact is at a location away from the electrical device after heating of the balls.

16. The method of claim 14 further comprising locating the electrical device on a substrate with the balls located between the electrical device and the substrate, and securing the balls to the substrate.

17. A method comprising:

locating a sheet between an electrical device and the substrate, the sheet having an electrical line formed thereon having a first contact portion over the electrical device and in contact with one of an array of solder balls, a probe contact at a location away from the electrical device, and a line interconnecting the first contact portion and the probe contact, the sheet having a hole formed therethrough to receive the one of the solder balls through the hole; and contacting the probe contact with an electrical probe.

18. The method of claim 17 wherein the electrical line includes a conductive material formed through the hole.

19. The method of claim 18 wherein the electrical line includes a second contact portion formed on a second surface of the sheet in contact with the conductive material.

* * * * *